(12) United States Patent
Xia

(10) Patent No.: US 8,250,722 B2
(45) Date of Patent: Aug. 28, 2012

(54) METHOD FOR REPAIRING MOTHERBOARD

(75) Inventor: Yi Xia, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 426 days.

(21) Appl. No.: 12/603,644

(22) Filed: Oct. 22, 2009

(65) Prior Publication Data

US 2011/0016687 A1  Jan. 27, 2011

(30) Foreign Application Priority Data

Jul. 23, 2009  (CN) .......................... 2009 1 0304700

(51) Int. Cl.
  *B23P 19/04* (2006.01)
(52) U.S. Cl. ................................................... 29/402.08
(58) Field of Classification Search ............... 29/402.08, 29/402.01, 402.03, 402.21, 426.4, 426.1, 29/762, 525.14
See application file for complete search history.

(56) References Cited

U.S. PATENT DOCUMENTS 7,787,254 B2 * 8/2010 Clayton et al. ................ 361/749
2007/0212906 A1 * 9/2007 Clayton et al. ................ 439/77

* cited by examiner

*Primary Examiner* — John C Hong

(74) *Attorney, Agent, or Firm* — Altis Law Group, Inc.

(57) ABSTRACT

A method is utilized for repairing a motherboard with a defective dual inline memory module (DIMM) socket mounted thereon be surface mounted technology (SMT). The method includes following steps. Repair tools including a ball grid array (BGA) rework device, a steel bar, a nozzle, and a steel sheet are provided. The BGA rework device, the nozzle are align with the defective DIMM on the motherboard for heating up solder balls between the defective DIMM and the motherboard until the solder balls are melted. The defective DIMM is removed from the motherboard. The steel bar is installed on a replacement DIMM to detect a planarity of a bottom face of the replacement DIMM. The replacement DIMM is mounted on the motherboard to replace the defective DIMM if the replacement DIMM is qualified.

16 Claims, 5 Drawing Sheets

| Repair tools | BGA rework device |
| --- | --- |
| | Steel sheet |
| | Steel bar |
| | Nozzle |
| | 40X-microscope, 3D-microscope, X-Ray microscope |
| | Solder paste, desoldering wire, solder iron, tweezer, and etc |

FIG. 2

METHOD FOR REPAIRING MOTHERBOARD

BACKGROUND

1. Technical Field

The present disclosure relates to a method for repairing a motherboard with a defective Dual Inline Memory Module (DIMM) socket mounted thereon.

2. Description of Related Art

A DIMM, comprises a series of dynamic random access memory (DRAM) integrated circuits. These modules are mounted on a printed circuit board and designed for use in personal computers, workstations or servers. There are three types of DIMMs: DDR (double-data-rate), DDR2 and DDR3, each having a different pin-count, and different notch position. DDR2 and DDR3 DIMMs were developed from the original DDR DIMM.

DDR or DDR2 DIMM sockets are usually mounted on the motherboard via a plurality of through holes defined in the motherboard. The DDR or DDR2 DIMM sockets have a plurality of pins extending through the corresponding holes in the motherboard. DDR3 DIMM sockets are usually mounted on the motherboard using surface mount technology (SMT). There are a plurality of solder balls physically and electrically connected between the DDR3 DIMM socket and the motherboard. However, solder connections between the DDR3 DIMM socket and the motherboard may be accidentally omitted or connected together, causing an incorrect electrical connection between the DDR3 DIMM socket and the motherboard. The motherboards with defective DIMM sockets are usually scrapped since typical methods for repairing the motherboards have a very low success rate. It's very wasteful to scrap motherboards, thus, it's necessary to develop an improved method for repairing the motherboards having defective DIMM sockets.

BRIEF DESCRIPTION OF THE DRAWINGS

FIG. 2 is a diagram listing repair tools that can be used to repair the motherboard;

DETAILED DESCRIPTION

Figure 1:
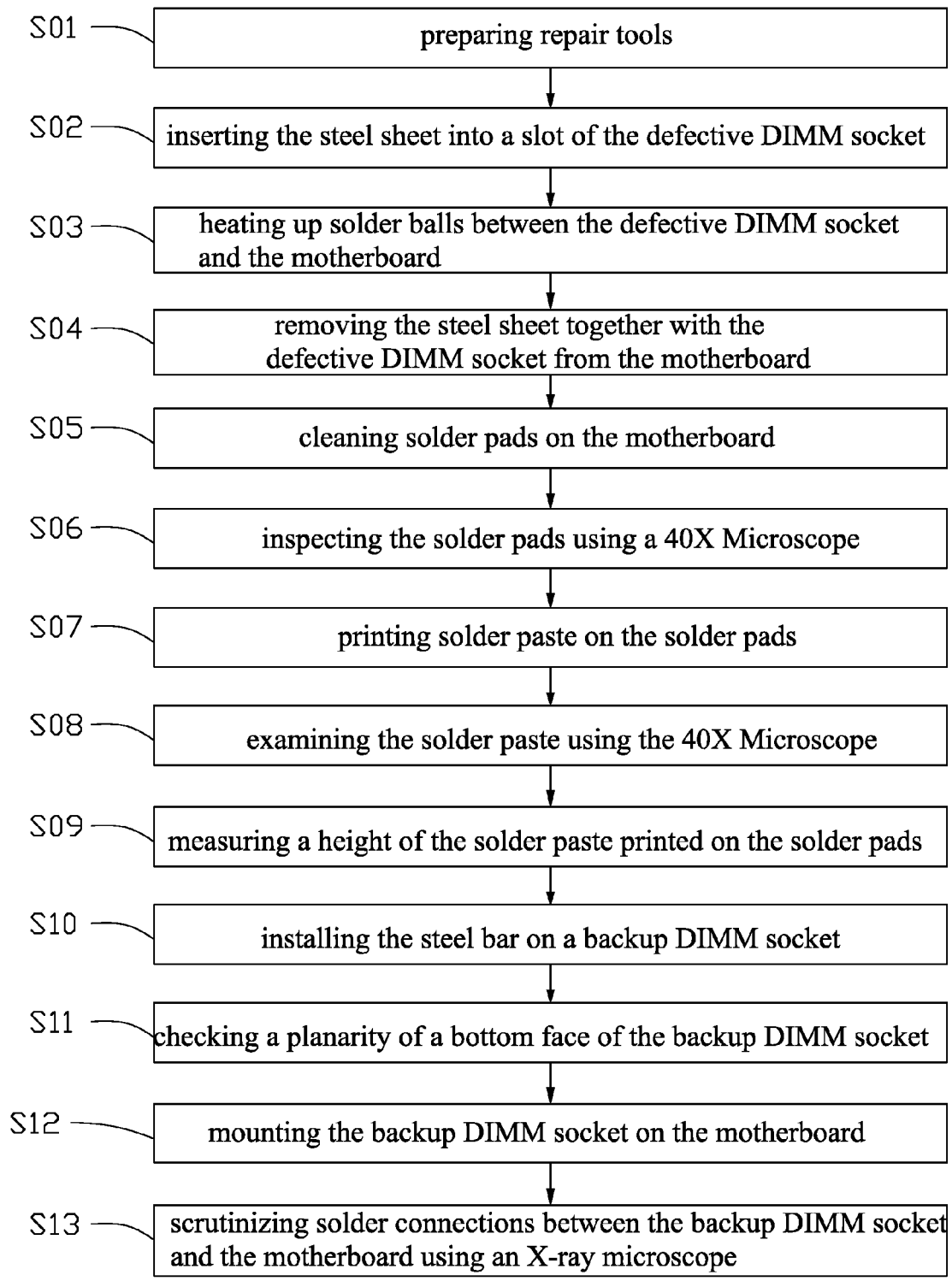
FIG. 1 is a flow chart of an embodiment for repairing a motherboard with a defective DIMM socket mounted thereon in accordance with the present disclosure.
Figure 3:
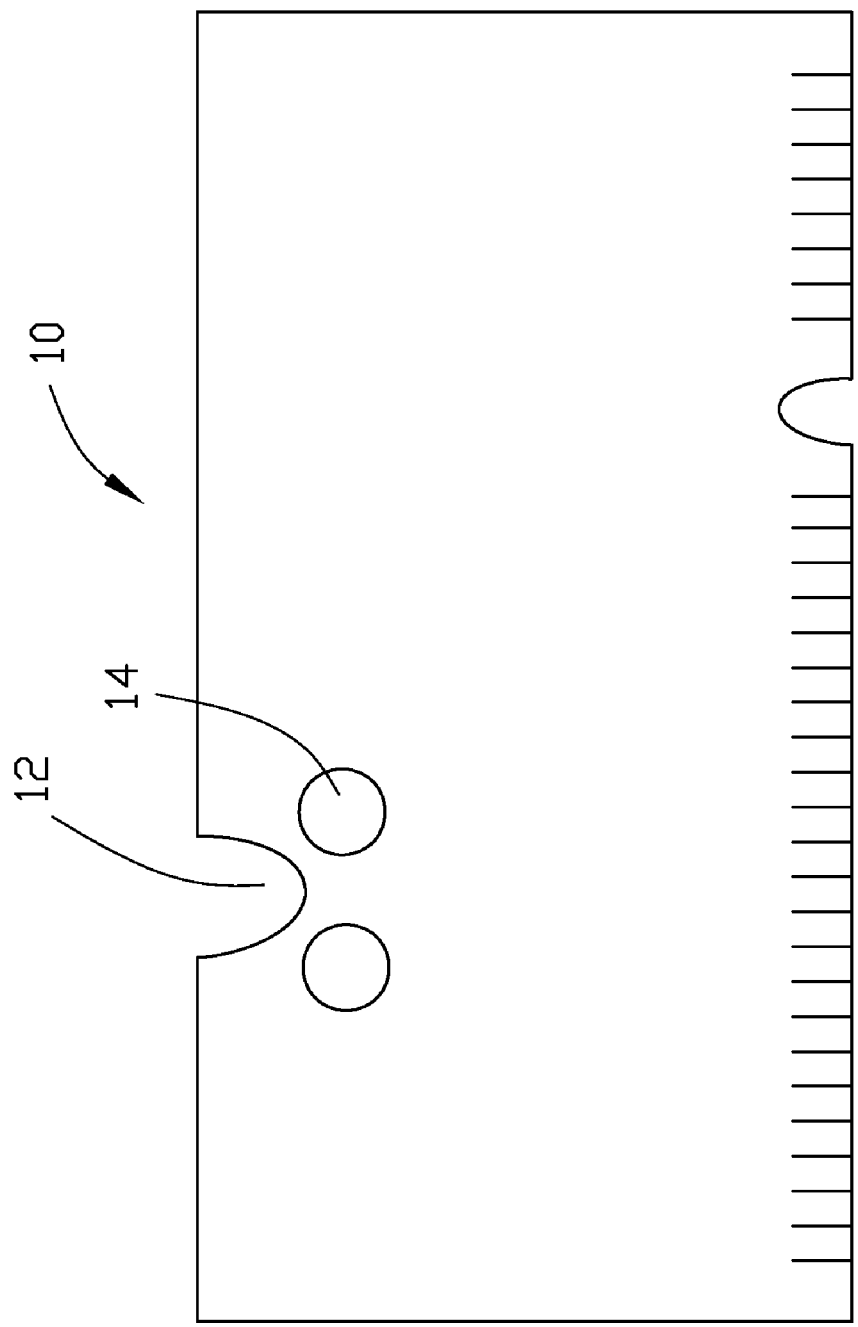
FIG. 3 illustrates the steel sheet listed in FIG. 2.
Figure 4:
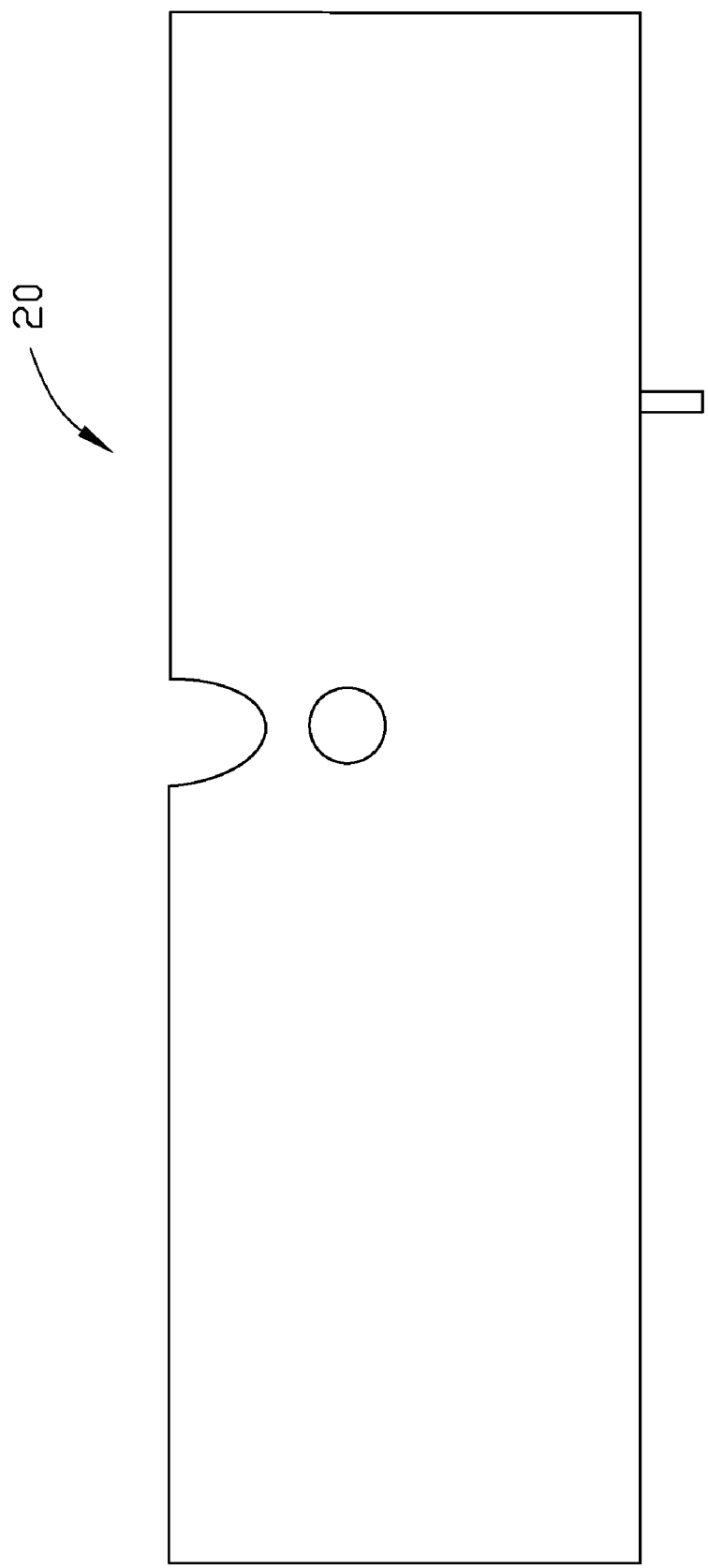
FIG. 4 illustrates the steel bar listed in FIG. 2.
Figure 5:
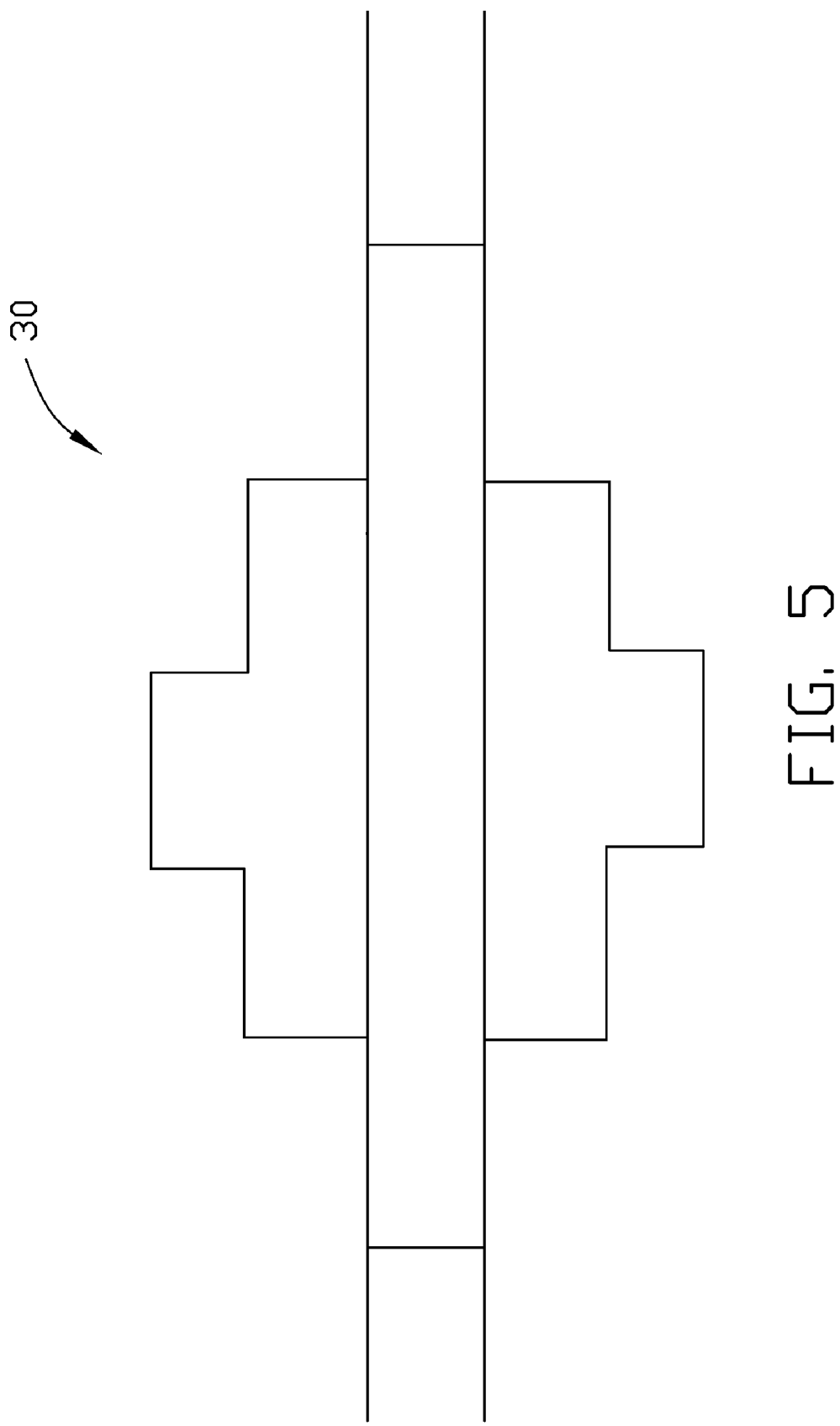
FIG. 5 illustrates the nozzle listed in FIG. 2.

Referring to FIG. 1, an embodiment is shown for repairing a motherboard with a defective dual inline memory module (DIMM) socket mounted thereon (not shown) by surface mount technology (SMT). The repair method includes the following blocks.

In block S01, repair tools are provided. In one embodiment, as seen in FIGS. 2~5, the repair tools include a ball grid array (BGA) rework device, a steel sheet (labeled 10 in FIG. 3), a steel bar (labeled 20 in FIG. 4), a nozzle (labeled 30 in FIG. 5), a 40×-microscope, a 3D-microscope, a X-Ray microscope, solder paste, a desoldering wire, a solder iron, and tweezers. The BGA rework device is capable of generating hot air to heat solder balls between the defective DIMM socket and the motherboard. The nozzle 30 fits the BGA rework device and is capable of guiding the hot air from the BGA rework device to a middle portion and two sides of the defective DIMM socket due to its specially designed shape (see FIG. 5). The steel sheet 10 is shaped similarly to a DDR3 DIMM card that has golden fingers (pins) and a lower notch at a bottom edge thereof, and so is capable of being inserted into a slot of the DIMM socket. The steel bar 20 is thicker than the steel sheet 10, and it is installed on a replacement DIMM socket for pressing the replacement DIMM socket and facilitating checking a planarity of a bottom surface of the replacement DIMM socket. The solder iron is capable of heating up the desoldering wire to absorb residual solder on the motherboard. The microscopes are utilized for inspecting solder balls, solder pads, solder paste, etc., during repairing the motherboard.

In block S02, the steel sheet 10 is tightly inserted into the slot of the defective DIMM socket. The steel sheet 10 defines an upper notch 12 at a top and central portion thereof. The upper notch 12 can be taken as a reference point for alignment with the nozzle 30 and the BGA rework device. A pair of through holes 14 is defined in the steel sheet 10 below the upper notch 12. The tweezers are capable of extending into the through holes 14 of the steel sheet 10 for pulling up the steel sheet 10 together with the defective DIMM socket from the motherboard.

In block S03, the BAG rework device and the nozzle 30 are aligned with the steel sheet 10 inserted in the defective DIMM socket using the upper notch 12 of the steel sheet 10 as the reference point. Then the defective DIMM socket is placed under the BGA rework device and the nozzle 30 for heating solder balls between the defective DIMM socket and the motherboard until the solder balls are melted.

In block S04, the tweezers extend into two holes of the steel sheet 10 to remove the steel sheet 10 together with the defective DIMM socket from the motherboard. The steel sheet 10 and the tweezers are utilized to avoid a user touching other components in proximity to the defective DIMM socket with their hands.

In block S05, the desoldering wire and the solder iron are utilized to clean the solder pads on the motherboard.

In block S06, the cleaned solder pads on the motherboard are inspected using the 40× Microscope for ensuring that there is no residual solder on the solder pads.

In block S07, solder paste is printed on the solder pads.

In block S08, the solder paste printed on the solder pads is examined using the 40× Microscope for ensuring that the solder paste is properly printed on the solder pads on the motherboard.

In block S09, a height of the solder paste is measured to ensure that all the solder pads are at the same height.

In block S10, the steel bar 10 is installed on a replacement DIMM socket.

In block S11, a planarity of a bottom face of the replacement DIMM socket is checked to ensure that the bottom surface of the backup DIMM socket is planar.

In block S12, the solder paste on the motherboard is heated up and the replacement DIMM socket is then mounted on the motherboard to replace the defective DIMM socket if the replacement DIMM is qualified.

In block S13, the solder connections between the backup DIMM socket and the motherboard is scrutinized under the X-ray microscope.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

It is also to be understood that the above description and the claims drawn to a method may include some indication in reference to certain steps. However, the indication used is only to be viewed for identification purposes and not as a suggestion as to an order for the steps.

What is claimed is:

1. A method for repairing a motherboard with a defective dual inline memory module (DIMM) socket mounted thereon by surface mounted technology (SMT), the method comprising:
   providing a ball grid array (BGA) rework device, a steel bar, a nozzle, and a steel sheet;
   placing the defective DIMM socket on the motherboard under the BGA rework device and the nozzle;
   heating solder balls between the defective DIMM socket and the motherboard;
   removing the defective DIMM socket from the motherboard;
   installing the steel bar on a replacement DIMM socket;
   checking a planarity of a bottom surface of the replacement DIMM socket; and
   mounting the replacement DIMM socket on the motherboard if the replacement DIMM socket is qualified.

2. The method of claim 1, further comprising inserting the steel sheet into a slot of the defective DIMM socket before heating the solder balls.

3. The method of claim 1, wherein the BGA rework device generates hot air and the nozzle guides the hot air to a middle portion and two sides of the defective DIMM socket for the heating the solder balls.

4. The method of claim 1, further comprising cleaning solder pads on the motherboard after removing the defective DIMM socket from the motherboard.

5. The method of claim 4, further comprising inspecting the solder pads on the motherboard after cleaning the solder pads.

6. The method of claim 5, further comprising printing solder paste on the solder pads on the motherboard after inspecting the solder pads.

7. The method of claim 6, further comprising examining the solder paste printed on the motherboard after printing the solder paste on the motherboard.

8. The method of claim 7, further comprising measuring a height of the solder paste after examining the solder paste.

9. A method for repairing a motherboard with a defective dual inline memory module (DIMM) socket mounted thereon by surface mounted technology, the method comprising:
   providing a ball grid array (BGA) rework device, a steel bar, a nozzle, and a steel sheet;
   inserting the steel sheet into a slot of the defective DIMM socket;
   heating solder balls between the defective DIMM socket and the motherboard;
   removing the steel sheet together with the defective DIMM socket from the motherboard;
   installing the steel bar on a replacement DIMM socket;
   checking a planarity of a bottom surface of the replacement DIMM socket; and
   mounting the replacement DIMM on the motherboard if the replacement DIMM socket is qualified.

10. The method of claim 9, further comprising aligning the BGA rework device, the nozzle, and the steel sheet before heating the solder balls.

11. The method of claim 9, further comprising cleaning solder pads on the motherboard after removing the defective DIMM socket from the motherboard.

12. The method of claim 11, further comprising inspecting the solder pads on the motherboard after cleaning the solder pads.

13. The method of claim 12, further comprising printing solder paste on the solder pads on the motherboard after inspecting the solder pads.

14. The method of claim 13, further comprising examining the solder paste printed on the motherboard after printing the solder paste on the solder pads on the motherboard.

15. The method of claim 9, further comprising scrutinizing solder connections between the replacement DIMM socket and the motherboard after the replacement DIMM socket is mounted on the motherboard.

16. The method of claim 15, further comprising measuring a height of the solder paste after examining the solder paste.

* * * * *